United States Patent
Katti et al.

(10) Patent No.: US 9,042,164 B2
(45) Date of Patent: May 26, 2015

(54) ANTI-TAMPERING DEVICES AND TECHNIQUES FOR MAGNETORESISTIVE RANDOM ACCESS MEMORY

(75) Inventors: Romney R. Katti, Shorewood, MN (US); James L. Tucker, Clearwater, FL (US); Anuj Kohli, Apple Valley, MN (US)

(73) Assignee: Honeywell International Inc., Morristown, NJ (US)

( * ) Notice: Subject to any disclaimer, the term of this patent is extended or adjusted under 35 U.S.C. 154(b) by 471 days.

(21) Appl. No.: 13/429,761

(22) Filed: Mar. 26, 2012

(65) Prior Publication Data
US 2013/0250663 A1    Sep. 26, 2013

(51) Int. Cl.
| | | |
|---|---|---|
| G11C 11/00 | (2006.01) |
| H01L 23/00 | (2006.01) |
| H01L 27/22 | (2006.01) |
| H01L 43/02 | (2006.01) |
| H01L 43/08 | (2006.01) |

(52) U.S. Cl.
CPC ............ *H01L 23/576* (2013.01); *H01L 27/228* (2013.01); *H01L 43/02* (2013.01); *H01L 43/08* (2013.01); *H01L 2924/16152* (2013.01); *H01L 2924/0002* (2013.01)

(58) Field of Classification Search
CPC ........ G11C 11/14; G11C 11/15; G11C 11/16; G11C 13/0059
USPC ...................... 365/185.04, 96, 158, 171, 173
See application file for complete search history.

(56) References Cited

U.S. PATENT DOCUMENTS

| | | |
|---|---|---|
| 6,650,564 B1 | 11/2003 | Earl et al. |
| 6,654,278 B1 | 11/2003 | Engel et al. |
| 6,826,086 B1 | 11/2004 | Smith et al. |
| 6,888,773 B2 | 5/2005 | Morimoto |
| 7,089,350 B2 | 8/2006 | Koren et al. |
| 7,193,889 B2 | 3/2007 | Sharma |
| 7,224,601 B2 | 5/2007 | Panchula |
| 7,430,135 B2 | 9/2008 | Huai et al. |
| 7,499,313 B2 | 3/2009 | Katti |
| 7,508,042 B2 | 3/2009 | Guo |
| 7,522,446 B2 | 4/2009 | Lee et al. |
| 7,581,118 B2 | 8/2009 | McGovern |
| 7,873,870 B2 | 1/2011 | Ohara |
| 7,898,855 B2 * | 3/2011 | Merry et al. ............. 365/185.04 |
| 7,932,571 B2 | 4/2011 | Rizzo et al. |
| 7,936,603 B2 | 5/2011 | Merry, Jr. et al. |
| 7,969,806 B2 | 6/2011 | De Ambroggi et al. |
| 7,995,402 B2 | 8/2011 | Banerjee et al. |
| 2006/0152173 A1* | 7/2006 | Erez ................................. 315/307 |
| 2009/0147601 A1* | 6/2009 | Chen ............................. 365/200 |
| 2009/0201732 A1 | 8/2009 | Salessi et al. |
| 2010/0146641 A1* | 6/2010 | Lenssen et al. .................. 726/34 |
| 2011/0026305 A1 | 2/2011 | Reed et al. |
| 2011/0026322 A1 | 2/2011 | Ohmori et al. |
| 2011/0032744 A1 | 2/2011 | Ohmori et al. |
| 2011/0062538 A1 | 3/2011 | Rizzo et al. |

OTHER PUBLICATIONS

Kissel et al., "Guidleines for Media Sanitization", NIST Special Publication 800-88, Sep. 2006, 43 pages.

\* cited by examiner

*Primary Examiner* — Han Yang
(74) *Attorney, Agent, or Firm* — Shumaker & Sieffert, P.A.

(57) ABSTRACT

A system may include circuitry and a magnetoresistive random access memory (MRAM) die including at least one MRAM cell. The circuitry may be configured to detect attempted tampering with the MRAM die and generate a signal based on the detected attempted tampering. The signal may be sufficient to damage or destroy at least one layer of the at least one MRAM cell or a fuse electrically connected to a read line of the at least one MRAM cell.

20 Claims, 4 Drawing Sheets

ANTI-TAMPERING DEVICES AND TECHNIQUES FOR MAGNETORESISTIVE RANDOM ACCESS MEMORY

TECHNICAL FIELD

The disclosure relates to magnetoresistive random access memory (MRAM), and more particularly, to techniques for hindering tampering with the MRAM.

BACKGROUND

MRAM is a non-volatile memory technology in which data is stored using magnetic domains. Because MRAM is non-volatile, the data stored in the magnetic domains is maintained without requiring power to continually refresh the magnetic domains. Additionally, MRAM may provide desirable read speeds, write speeds, and device longevity. Because of these characteristics, MRAM may be used in a variety of applications, such as long-term storage (e.g., in place of or as a complement to a hard disc drive or a solid state drive), or device memory (e.g., in place of or as a complement to dynamic random access memory (DRAM) and/or static random access memory (SRAM)).

SUMMARY

Techniques, devices and systems for modifying or deleting at least some data stored on an MRAM die are described herein. In an MRAM die, the data is stored in a plurality of MRAM cells. The MRAM cells may each include multiple layers, including a free magnetic layer and a fixed magnetic layer. Information is stored in an MRAM cell based on a magnetic orientation of the free magnetic layer relative to a magnetic orientation of the fixed magnetic layer.

In accordance with some examples of this disclosure, circuitry detects attempted tampering with the MRAM die or a MRAM package at least partially enclosing the MRAM die and generates a signal that damages at least one MRAM cell or a read path of at least one MRAM cell to complicate or prevent access to the information stored by the MRAM cell before the detection of the attempted tampering. The signal may be a voltage or current signal. In some examples, the signal may damage a portion of the MRAM cell or read path in a manner that complicates or makes impossible recovery of the data stored by the MRAM cell before the detected tampering.

In one example, the disclosure is directed to a system that includes an MRAM die comprising at least one MRAM cell, and circuitry configured to detect attempted tampering with the MRAM die and generate a signal sufficient to damage the at least one MRAM cell in response to detecting the attempted tampering with the MRAM die.

In another example, the disclosure is directed to a system that includes an MRAM die that includes at least one MRAM cell, a read line electrically connected to the at least one MRAM cell, and a fuse electrically connected to the read line. In accordance with this aspect of the disclosure, the system also includes circuitry configured to detect attempted tampering with the MRAM die and generate a signal sufficient to damage the fuse in response to detecting the attempted tampering with the MRAM die.

In a further aspect, the disclosure is directed to a method that includes detecting attempted tampering with an MRAM die and, in response to detecting the attempted tampering with the MRAM die, generating signal sufficient to damage at least one MRAM cell in the MRAM die or a fuse electrically connected to a read line of the at least one MRAM cell.

The details of one or more examples are set forth in the accompanying drawings and the description below. Other features, objects, and advantages of the disclosure will be apparent from the description and drawings, and from the claims.

DETAILED DESCRIPTION

Figure 1:
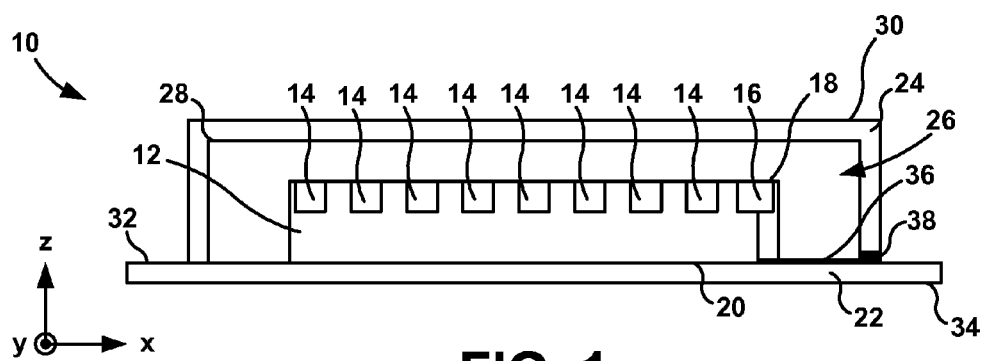
FIG. 1 is a conceptual and schematic cross-sectional diagram of an example MRAM package.

Techniques, devices and systems for modifying or deleting at least some data stored on an MRAM die in response to detected tampering (e.g., activities associated with attempted tampering) with an MRAM package are described herein. In some examples, circuitry is configured to detect attempted tampering with the MRAM die or an MRAM package at least partially enclosing the MRAM die. In response to detecting attempted tampering, the circuitry is configured to generate a signal sufficient to damage at least one MRAM cell or a fuse in a read path of at least one MRAM cell to complicate or prevent access to original data stored by the MRAM cell (e.g., data stored by the MRAM cell before the circuitry detected the attempted tampering). In some examples, the signal may be a voltage or current signal having a sufficient amplitude and duration to damage the at least one MRAM cell or a fuse in a read path of at least one MRAM cell.

In various examples, damaging the at least one MRAM cell may include melting together adjacent layers in the MRAM cell, heating a layer of the MRAM cell to cause diffusion between the layer and an adjacent layer, or causing a tunnel barrier layer in the MRAM cell to be damaged, thus electrically shorting a free magnetic layer and a fixed magnetic layer. For example, the MRAM cell may be heated using a current pulse to a temperature of greater than about 500° C. In some examples, the temperature may be sufficient to damage the MRAM cell in less than about 1 millisecond (ms). Damaging the MRAM cell in a short time may increase a chance that an unauthorized user is able to access data stored by the MRAM cell before damage to the cell.

The circuitry may be located in the MRAM die, in another semiconductor die disposed within the MRAM package, or may be part of another semiconductor die disposed outside of the MRAM package and electrically connected to the MRAM die. In some examples, the signal may damage a portion of the MRAM cell or read path in a manner that causes data clearing or data sanitization. As used herein, data clearing indicates a modification to the MRAM cell or read path that prevents recovery of the data stored by the MRAM cell using electrical circuitry, but which may not prevent recovery of the data stored by the MRAM cell using invasive techniques. In one type of invasive technique, a microprobe may be moved over a surface of the MRAM die, and may establish electrical contact with an on-chip bus line. An external digital signal processor card may then be connected to the MRAM die via the microprobe and the external processor may be used to read the MRAM cell.

In another type of invasive technique, layers of the MRAM die over the free magnetic layers may be removed from the MRAM die and a magnetic force microscopy (MFM) probe may be scanned over the free magnetic layers to determine a magnetic orientation of each of the free magnetic layers. Layers of the MRAM die above the fixed magnetic layer then may be removed, and the MFM probe may be scanned over the fixed magnetic layers to determine a magnetic orientation of each of the fixed magnetic layers. The values of the MRAM cells may then be determined by comparing corresponding fixed and free magnetic layers.

In another type of invasive technique, layers of the MRAM die over the free magnetic layers may be removed from the MRAM die and an optical technique, such as the magneto-optical Kerr effect technique, may be used to determine magnetic orientations of respective free magnetic layers. Layers of the MRAM die above the fixed magnetic layer then may be removed, and the optical technique may be used to determine magnetic orientations of respective fixed magnetic layers. The values of the MRAM cells may then be determined by comparing corresponding fixed and free magnetic layers.

As used herein, data sanitization indicates a modification to the MRAM cell or read path that prevents recovery of the data stored by the MRAM cell using electrical circuitry and invasive techniques. For example, the data sanitization may alter the ability of a MRAM cell to hold a magnetic state. In this way, the circuitry may make unauthorized retrieval of data stored by the MRAM die more difficult or impossible.

By making unauthorized retrieval of data stored by the MRAM die more difficult or impossible, the circuitry may protect the data stored by the MRAM die. Protection of data stored by the MRAM die with the circuitry in this manner may be useful if, for example, MRAM die stores confidential information, such as classified information to which access is restricted by law or regulation to particular groups of persons or other intellectual property of an individual or entity. Data security may be a concern with MRAM, as MRAM is a nonvolatile memory technology in which data is retained in the MRAM cells even when power is not provided to the MRAM.

FIG. 1 is a conceptual and schematic cross-sectional diagram of an example MRAM package 10 in accordance with some aspects of the disclosure. MRAM package 10 includes a substrate 22 and a cover 24. Together, substrate 22 and cover 24 define a cavity 26. Disposed in cavity 26 is an MRAM die 12. In this way, MRAM package 10 encloses MRAM die 12. In some examples, substrate 22 and cover 24 define a substantially fully enclosed cavity 26 (e.g., fully enclosed or nearly fully enclosed). In other examples, substrate 22 and cover 24 may define a partially enclosed cavity 26. In some instances in which substrate 22 and cover 24 define a substantially fully enclosed cavity 26, substrate 22 and cover 24 may form a hermetic enclosure around MRAM die 12. Although only two portions of the side walls of cover 24 are shown in FIG. 1, in some examples, cover 24 may include sidewalls that extend from a top surface of cover down to substrate 22 to substantially surround die 12. The sidewalls may or may not extend perpendicularly to substrate 22.

Substrate 22 may be formed of any of a variety of materials, such as a metal or alloy, a ceramic, or a plastic. For example, substrate 22 may be formed of alumina ($Al_2O_3$), aluminum nitride (AlN), beryllium oxide (BeO), or the like. In some examples, substrate 22 may include at least one electrically conductive pathway (e.g., a trace or via) extending between an internal surface 32 of substrate 22 and an external surface 34 of substrate 22. The at least one electrically conductive pathway may be coupled to electrical circuitry of MRAM die 12 using, for example, a ball grid array, wire bonds, or the like. In this way, the at least one electrically conductive pathway may facilitate electrical communication between MRAM die 12 and circuitry outside of MRAM package 10 (e.g., circuitry defined by other electrical components on a printed board).

Cover 24 may define an internal surface 28 and an external surface 30. Cover 24 also may be formed of any of a variety of materials, such as a metal or alloy, a ceramic, or a plastic. For example, cover 24 may be formed of alumina ($Al_2O_3$), aluminum nitride (AlN), beryllium oxide (BeO), or the like.

MRAM die 12 is disposed within package 10, e.g., in cavity 26. MRAM die 12 may be mechanically and electrically connected to substrate 22. For example, electrically conductive pads (not shown) on bottom surface 20 of MRAM die 12 may be soldered to electrically conductive pads (not shown) on internal surface 32 of substrate 22. As another example, bottom surface 20 of MRAM die 12 may be adhered to internal surface 32 of substrate 22 using an adhesive and electrically conductive pads (not shown) on top surface 18 of MRAM die 12 may be wire bonded to electrically conductive pads (not shown) on internal surface 32 of substrate 22.

MRAM die 12 may be formed partially of a semiconductor material, such as, for example, silicon. MRAM die 12 may include other materials, such as dielectric materials (e.g., silicon dioxide ($SiO_2$), silicate glass, or SiOC), and metals or alloys for interconnects between MRAM cells 14 and between MRAM cells 14 and other circuitry in MRAM die 12 and external to MRAM die 12. MRAM die 12 also may include metals or alloys in the magnetic stack of MRAM cells 14, as described below.

MRAM die 12 includes a plurality of MRAM cells 14. Although FIG. 1 shows only one cross-sectional view of MRAM die 12, and hence shows MRAM cells 14 extending along one direction (e.g., the x-axis shown in FIG. 1, where orthogonal x-y-z axes are shown in FIG. 1 for ease of description only), MRAM die 12 may include a two- or three-dimensional array of MRAM cells 14 (e.g., MRAM cells 14 may be arrayed in a two-dimensional layer parallel to the x-y plane shown in FIG. 1).

MRAM cells 14 are the individual structures that are configured to store data magnetically in MRAM die 12. For example, each of MRAM cells 14 may include a fixed magnetic layer, a tunnel barrier layer, and a free magnetic layer (shown in, e.g., FIG. 2A). An orientation of the magnetic moment of the fixed magnetic layer is fixed at the temperatures and external magnetic fields in which MRAM die 12 is designed for use. The orientation of the magnetic moment of the free magnetic layer may be switched between two states, each state representing a bit (e.g., a 0 or 1).

MRAM die 12 also may include circuitry 16. Circuitry 16 may be configured to detect attempted tampering by an unauthorized user with MRAM die 12. In other implementations, another semiconductor die may include circuitry 16, and the other semiconductor die may be enclosed in MRAM package 10 or may be disposed outside MRAM package 10 (e.g., electrically connected to a printed board to which MRAM package 10 is electrically connected). For example, circuitry 16 may include or be electrically connected (by electrical trace 36) to a sensor 38 that is configured to detect removal of cover 24 from substrate 22. In some examples, sensor 38 may be in a different position relative to MRAM cells 14 in addition to or instead of the position shown in FIG. 1. For example, sensor 38 may be positioned on top surface 30 of cover 24 or surface 18 of MRAM die 12. In these examples, sensor 38 may be configured to detect attempted physical tampering with cover 24 (e.g., removal of cover 24) or MRAM die 12 (e.g., attempted removal of surface 18 of die 12 to expose MRAM cells 14), either of which may indicate an attempt to tamper with data stored by MRAM die 12.

Any suitable sensor 38 (or combination of sensors) may be used. In some examples, sensor 38 may include a thin film sensor configured such that an electrical parameter (e.g., resistance, inductance, or capacitance) or a chemical parameter of sensor 38 changes in response to physical tampering with a portion of MRAM package 10 adjacent sensor 38. A change in the parameter may be correlated to a tamper event. Circuitry 16 may be configured to interpret physical tampering with a portion of MRAM package 10 as an attempt to tamper with MRAM die 12.

For example, sensor 38 may include one or more strain gauges or stress gauges that are configured to change resistance in response to changes in strain or stress forces applied to sensor 38. Different forces may be applied to sensor 38 during attempted tampering with MRAM package 10. In these examples, circuitry 16 may monitor a signal indicative of the resistance of sensor 38 and detect a tamper event when a threshold change in resistance or a threshold resistance is detected. The threshold change in resistance or threshold resistance indicative of an attempted tamper event may be stored by a memory, which may be provided by MRAM die 12 or a memory outside of package 10. In other examples, sensor 38 may change optical properties in response to physical tampering with a portion of MRAM package 10 adjacent sensor 38. Circuitry 16 may, for example, monitor a wavelength of light transmitted through sensor 38 and detect a change in wavelength.

As another example, circuitry 16 may be configured to determine when an unauthorized user attempts to electronically access data stored by MRAM die 12. For example, sensor 38 may include a photo sensor (e.g., light sensor) that detects a presence of an unauthorized user near a device (e.g., a computer) that includes MRAM die 12. Circuitry 16 may interpret the unauthorized presence of the person as an attempt to tamper with data stored by MRAM die 12. In some examples, circuitry 16 may be configured to detect electrical activity indicating attempted tampering with MRAM die 12 due to an access control violation. For example, data stored by MRAM die 12 may be password protected or protected by an access code. After a predetermined number of failed password or access code entries, circuitry 16 may determine than an unauthorized user is attempted to access data stored by MRAM die 12.

As discussed in further detail below, in response to detecting tampering (physical, electronic, or both) with MRAM die 12, circuitry 16 may be configured to generate a signal sufficient to damage or destroy at least one of MRAM cells 14 or otherwise prevents access to data stored by MRAM cells 16. In some instances, MRAM die 12 may not include circuitry 16, and, instead, circuitry outside of die 12 (e.g., provided by an integrated circuit within cavity 26 or outside of cavity 26) may be used to detect tampering with MRAM package 10.

Regardless of where circuitry 16 is located and how circuitry 16 determines that an unauthorized user is attempting to tamper with MRAM package 10, circuitry 16 may be configured to generate a signal in response to determining that an unauthorized user is attempting to tamper with MRAM package 10. In some examples, the signal may include a current or voltage signal. The signal may be sufficient to damage at least one of MRAM cells 14 or a read path electrically connected to at least one of MRAM cells 14 (not shown in FIG. 1). For example, the signal may have an amplitude (e.g., a voltage amplitude or current amplitude) and duration sufficient to cause such damage. As described above, in various examples, damaging at least one of MRAM cells 14 may include melting together adjacent layers in the MRAM cell, heating a layer of the MRAM cell to cause diffusion between the layer and an adjacent layer, or causing a tunnel barrier layer in the MRAM cell to be damaged, thus electrically shorting a free magnetic layer and a fixed magnetic layer. In some examples, damaging the read path may include damaging or destroying a fuse in the read path.

For example, circuitry 16 may generate a signal sufficient to heat the structure in MRAM cell 14 or the read path electrically connected to at least one of MRAM cells 14 to a temperature of greater than about 500° C. In some examples, the temperature may be sufficient to damage the MRAM cell or read path in less than about 1 ms. Damaging MRAM cell 14 or read path in a short time may increase a chance that an unauthorized user is able to access data stored by MRAM cell 14 before damage to the cell 14.

By damaging at least one of MRAM cells 14 or a read path of at least one of MRAM cells 14, access (e.g., reading of the cells 14) to the original data (e.g., data stored on the MRAM die before tampering) may be made more difficult or may be prevented. Protection of data stored by the MRAM die 12 with the circuitry 16 in this manner may be useful if, for example, MRAM die 12 stores confidential information, such as classified information to which access is restricted by law or regulation to particular groups of persons or other intellectual property of an individual or entity.

Figure 2:
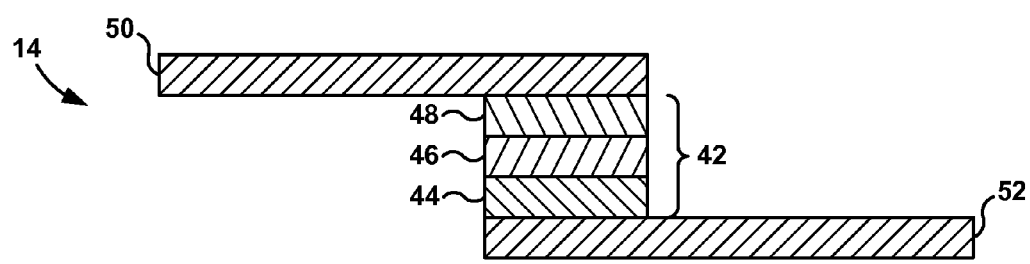
FIG. 2 is a conceptual and schematic cross-sectional diagram of an example configuration of an MRAM cell.

FIG. 2 is a conceptual and schematic cross-sectional diagram of an example configuration of MRAM cells 14. In the example illustrated in FIG. 2, MRAM cell 14 is a spin-transfer torque (STT)-MRAM cell. MRAM cell 14 includes a magnetic stack 42 comprising a fixed magnetic layer 44, a tunnel barrier layer 46, and a free magnetic layer 48.

Tunnel barrier layer 46 may include a dielectric, such as an oxide. In some examples, tunnel barrier layer 46 may include aluminum oxide ($Al_2O_3$) or magnesium oxide (MgO).

Fixed magnetic layer 44 includes a pinned magnetic moment. In some examples, fixed magnetic layer 44 may include a ferromagnetic metal or alloy, such as, for example, nickel (Ni), iron (Fe), or cobalt (Co), or alloys of Ni, Fe, or Co. Example alloys from which fixed magnetic layer 44 can be formed include nickel iron (NiFe), cobalt iron (CoFe), and nickel iron cobalt (NiFeCo).

In some examples, fixed magnetic layer 44 may be magnetically coupled to an antiferromagnetic layer (not shown in FIG. 2), which acts to pin the magnetic moment 76 of fixed magnetic layer. The antiferromagnetic layer may include an antiferromagnetic alloy, such as, for example, iron manganese (FeMn), nickel manganese (NiMn), iridium manganese (IrMn), or platinum manganese (PtMn). In some examples, the antiferromagnetic layer may be a bilayer or multilayer, in which the layers have different compositions or magnetic properties.

Figure 3A:
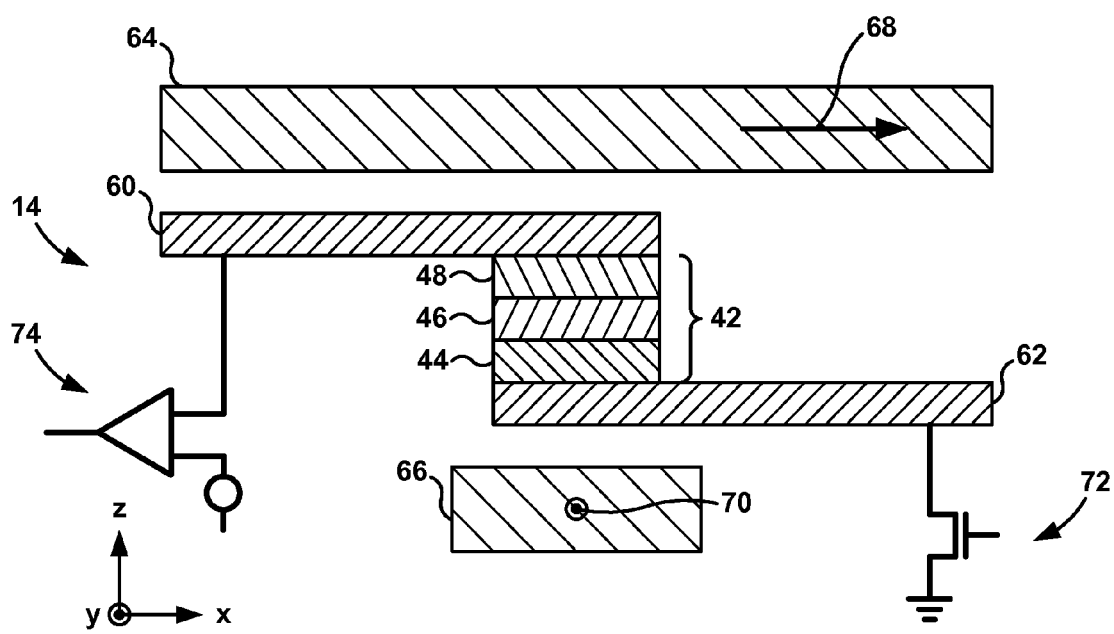
FIGS. 3A-3C are conceptual and schematic diagrams that illustrate another example of an MRAM cell.
Figure 3B:
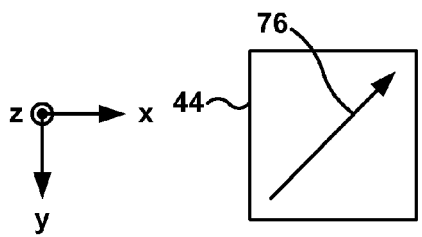
Figure 3C:
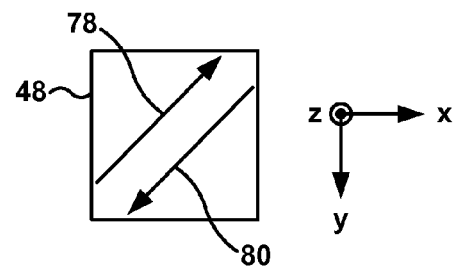

Free magnetic layer 48 includes a free magnetic moment that is free to rotate under influence of a sufficiently strong applied magnetic field, as discussed in further detail with respect to FIG. 3C. In some examples, free magnetic layer 48 may include a ferromagnetic metal or alloy, such as, for example, Ni, Fe, or Co, or alloys of Ni, Fe, or Co. Example alloys from which free magnetic layer 48 can be formed include NiFe, CoFe, and NiFeCo.

The magnetic moment of fixed magnetic layer 44 may be substantially fixed at temperatures and magnetic fields in which MRAM cell 14 will be used. The magnetic moment of free magnetic layer 48 is oriented using spin-oriented current that is directed through magnetic stack 42 using first electrode 50 and second electrode 52. In this way, first electrode 50 and second electrode 52 may form part of a write path for MRAM cell 14. In some examples, the magnetic moment of free magnetic layer 48 may be switched using the spin-oriented current between two, substantially antiparallel states (e.g., a first magnetic orientation that is substantially parallel to the magnetic orientation of fixed magnetic layer 44 and a second magnetic orientation that is substantially anti-parallel to the magnetic orientation of fixed magnetic layer 44). The orientation of the magnetic moment of free magnetic layer 48 relative to the orientation of the magnetic moment of fixed magnetic layer 44 may be determined by measuring the resistance of magnetic stack 42. The relative resistance is the storage mechanism of MRAM cells 14. For example, a high resistance may correspond to a logical state of "1," while a low resistance may correspond to a logical state of "0."

In some examples, first electrode 50 and second electrode 52 also form part of a read path used for reading data from MRAM cell 14 (e.g., measuring the resistance of magnetic stack 42). In other examples, MRAM cell 14 may include another electrically conductive pathway electrically connected to magnetic stack 42 for facilitating reading data from MRAM cell 14.

FIGS. 3A-3C are conceptual and schematic diagrams that illustrate another example of an MRAM cell 14. In some implementations, as shown in FIGS. 3A-3C, MRAM cell 14 may include a first write line 64 and a second write line 66, which are used to write data to MRAM cell 14. First write line 64 extends generally in the x-axis direction of FIG. 3A, while second write line 66 extends generally in the y-axis direction of FIG. 3A. MRAM cell 14 also includes a magnetic stack 42, which includes a free magnetic layer 48, a tunnel barrier layer 46, and a fixed magnetic layer 44. In some examples, magnetic stack 42 may be referred to as a magnetic tunnel junction (MTJ).

Fixed magnetic layer 44 includes a pinned magnetic moment 76, illustrated in FIG. 3B. In the illustrated example, pinned magnetic moment 76 is oriented at an approximately 45 degree angle to first write line 64 and second write line 66 (e.g., approximately a 45 degree angle to both the x-axis and y-axis in FIG. 3B, where orthogonal x-y-z axes are shown in FIGS. 3A-3C for ease of description).

Free magnetic layer 48 includes a free magnetic moment that is free to rotate under influence of a sufficiently strong applied magnetic field, as illustrated in FIG. 3C. For example, free magnetic layer 48 may have a first free magnetic moment 78 or a second free magnetic moment 80. Free magnetic layer 48 may be switched between first free magnetic moment 78 and a second free magnetic moment 80 by a sufficiently strong magnetic field, such as a magnetic field generated by first write line 64 and second write line 66.

For example, the magnetic moment of free magnetic layer 48 may be switched between first free magnetic moment 78 and a second free magnetic moment 80 using first write line 64 and second write line 66. An applied magnetic field may be produced by pulses of electric current flowing through first write line 64 and second write line 66. Consider an example in which the free magnetic moment of layer 48 begins with the orientation of first free magnetic moment 78. Electric current may be sent through first write line 64 in the direction indicated by arrow 68 (e.g., in the direction of the x-axis of FIG. 3A) and the magnetic moment of free magnetic layer 48 may rotate to be substantially parallel to arrow 68. While electric current still flows through first write line 64, current may be sent through second write line 66 in a direction indicated by arrow 70 (e.g., in the direction of the y-axis of FIG. 3A, out of the plane FIG. 3A), bringing the free magnetic moment to a substantially 45 degree angle between arrows 68 and 70. Current flow through first write line 68 is then ceased, and the free magnetic moment of free magnetic layer 48 rotates to be substantially parallel to the direction of current flow through second write line 66, indicated by arrow 70. Finally, current flow through second write line 66 is ceased, and the free magnetic moment of free magnetic layer 48 rotates to be oriented in the direction indicated by second free magnetic moment 80.

The orientation of free magnetic moment 78, 80 relative to the orientation of pinned magnetic moment 76 determines the resistance of magnetic stack 42. For example, the resistance of magnetic stack 42 when pinned magnetic moment 76 and second free magnetic moment 80 are oriented substantially anti-parallel is greater than the resistance of magnetic stack 42 when pinned magnetic moment 76 and first free magnetic moment 78 are oriented substantially parallel. The relative resistance of the magnetic stack 42 may be determined by flowing current from transistor 72 through bottom electrode 62 to magnetic stack 42, through top electrode 60 to op-amp 74, where the current is compared to a baseline or standard current. In this way, top electrode 60 and bottom electrode 62 for a part of the read path for magnetic stack 42 in the example shown in FIG. 3A. The relative resistance is the storage mechanism of MRAM cells 14. For example, a high resistance may correspond to a logical state of "1," while a low resistance may correspond to a logical state of "0."

Figure 4:
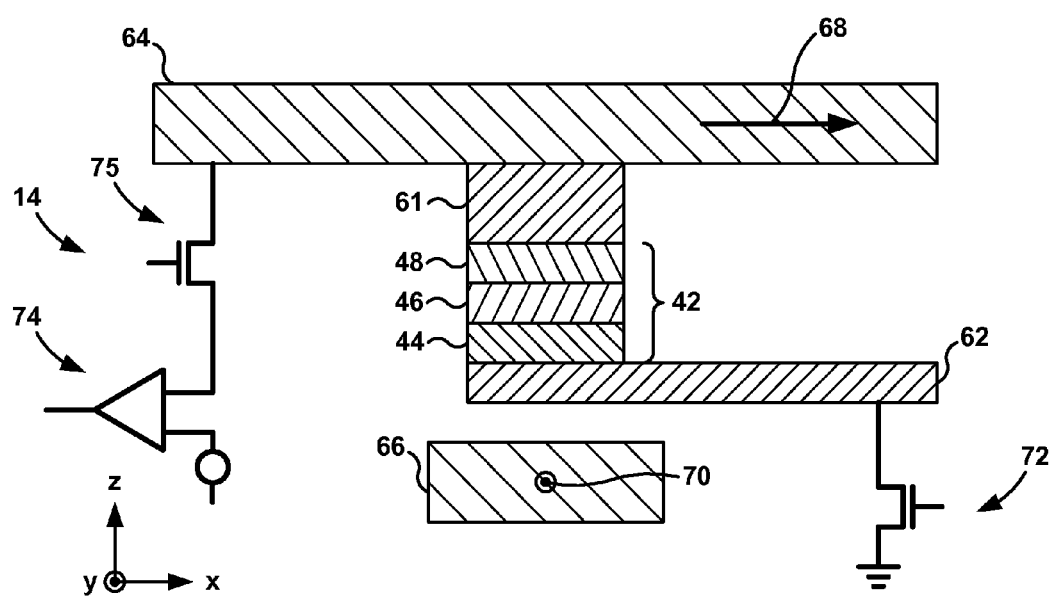
FIG. 4 is a conceptual and schematic cross-sectional diagram of another example configuration of an MRAM cell.

FIG. 4 is a conceptual and schematic cross-sectional diagram of another example configuration of MRAM cells 14. The configuration shown in FIG. 4 is similar to the configuration of MRAM cell 14 in FIG. 3A. However, unlike MRAM cell 14 shown in FIG. 3A, MRAM cell 14 shown in FIG. 4 does not include top electrode 60 directly connected to op-amp 74. Instead, a top electrode 61 is electrically connected between first write line 64 and magnetic stack 42. First write line 64 is then electrically connected to a transistor 75, which is electrically connected to op-amp 74. When writing to MRAM cell 14 (e.g., controlling an orientation of magnetic the free magnetic moment of free magnetic layer 48), transistor 75 and transistor 72 may be in an open state, such that op-amp 74 and magnetic stack 42 are isolated from the current flowing through first write line 64. However, when reading the state of MRAM cell 14, the transistors 72 and 75 may be in closed states so current flows from a voltage source, through transistor 72, through bottom electrode 62, through magnetic stack 42, through first write line 64, through transistor 75, and to op-amp 74.

Figure 5:
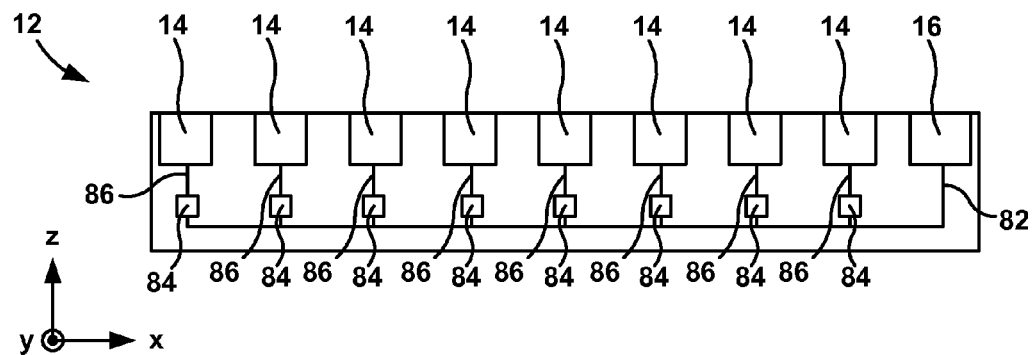
FIG. 5 is a conceptual and schematic cross-sectional diagram of an example configuration of an MRAM die.

FIG. 5 is a conceptual and schematic cross-sectional diagram of an example configuration of MRAM die 12 and illustrates an example electrical connection 82 between circuitry 16 and a plurality of MRAM cells 14. Similar to FIG. 1, FIG. 4 shows only one cross-sectional view of MRAM die 12, and hence shows MRAM cells 14 extending along one direction (e.g., the x-axis shown in FIG. 4, where orthogonal x-y-z axes are shown in FIG. 5 for ease of description only). However, MRAM die 12 may include a two- or three-dimensional array of MRAM cells 14 (e.g., MRAM cells 14 may be arrayed in a two-dimensional layer parallel to the x-y plane shown in FIG. 5, stacked in the z-axis direction, or both).

In the example illustrated in FIG. 5, MRAM cells 14 are connected to a common electrical connection 82 via respective electrical paths 86. In some examples, electrical paths 86 form a part of a read path of respective ones of MRAM cells 14. In other examples, electrical paths 86 form a part of a write path of respective ones of MRAM cells 14. For example, electrical paths 86 may include one or both of first electrode 50 or second electrode 52 shown and described with reference to FIG. 2 (where first electrode 50 and second electrode 52 may form a part of a read path, a write path, or both). As another example, electrical paths 86 may include one or both of top electrode 60 or bottom electrode 62 shown and described with reference to FIGS. 3A-3C (where top electrode 60 and bottom electrode 62 form a part of a read path).

In some examples, all of MRAM cells 14 may not be electrically connected to circuitry 16 using a common electrical connection 82. Instead, at least one (e.g., a plurality) of MRAM cells 14 may be electrically connected to circuitry 16 using a first electrical connection and at least one other (e.g., a plurality) of MRAM cells 14 may be electrically connected to circuitry 16 using a second electrical connection separate from the first electrical connection. In this way, circuitry 16 may be electrically connected to MRAM cells 14 using a single electrical connection 82 or a plurality of electrical connections 82.

Additionally or alternatively, although FIG. 5 illustrates all of MRAM cells 14 (e.g., all of MRAM cells 14 of die 12) being electrically connected to circuitry 16, this may not be the case in all examples. In some implementations, only some of MRAM cells 14 may be electrically connected to circuitry 16. For example, any number of MRAM cells 14 may be electrically connected to circuitry 16 (e.g., at least one of MRAM cells 14).

As described with respect to FIG. 1, circuitry 16 may be configured to detect attempted tampering with MRAM die 12 and generate a signal in response to the determination. For example, sensor 38 may include a photo sensor (e.g., light sensor) that detects a presence of an unauthorized user near a device (e.g., a computer) that includes MRAM die 12. Circuitry 16 may interpret the unauthorized presence of the person as an attempt to tamper with data stored by MRAM die 12. In some examples, circuitry 16 may be configured to detect electrical activity indicating attempted tampering with MRAM die 12 due to an access control violation. For example, data stored by MRAM die 12 may be password protected or protected by an access code. After a predetermined number of failed password or access code entries, circuitry 16 may determine than an unauthorized user is attempted to access data stored by MRAM die 12.

In some examples, circuitry 16 may be configured to interpret sensed tampering with MRAM package 10 as an attempt to tamper with MRAM die 12. The signal may have a power or energy sufficient to damage at least one of MRAM cells 14, at least one of fuses 84, or at least one of MRAM cells 14 and at least one of fuses 84. In some examples, circuitry 16 is configured to generate the signal having a predetermined power or energy level, which is selected to cause the damage to the at least one of MRAM cells 14, the at least one of fuses 84, or both, upon the application of the signal to the electrical circuit including the at least one of MRAM cells 14, the at least one of fuses 84, or both.

In some examples, MRAM package 10 (FIG. 1) or a system in which MRAM package 10 is installed may include a power source that provides the power for the signal. In some examples, the power source comprises a back-up power source, such that if power is no longer provided to the system or MRAM package 10 from a source external to the system (e.g., via a battery or wall outlet), the back-up power source can provide power for the signal. In some examples, the back-up power source includes a capacitor, super capacitor, or battery. The capacitor, super capacitor, or battery may be a part of MRAM package 10, or may be coupled to a system in which MRAM package 10 is installed, e.g., electrically connected to a printed board (PB) to which MRAM package 10 is connected.

In the example shown in FIG. 5, MRAM die 12 also includes a plurality of fuses 84. In other examples, MRAM die 12 may not include fuses 84. In implementations that include one or more fuses 84, respective fuses 84 may be electrically connected in read paths of one or more MRAM cells 14 (e.g., electrical paths 86 may be read paths when electrical paths 86 are connected to fuses 84). A respective fuse 84 may be electrically connected to a respective one of electrical paths 86 for a respective one of MRAM cells 14. In some examples, as shown in FIG. 5, each one of electrical paths 86 may be electrically connected to a respective fuse 84. In other examples, less than all of electrical paths 86 may include or be electrically connected to a respective fuse 84. Fuses 84 may be configured to be damaged or destroyed upon application of a predetermined electric current amplitude. When a fuse 84 is electrically connected in a read path of an MRAM cell 14, damage to or destruction of the fuse 84 may make reading of data stored by the MRAM cell 14 using electronic circuitry more difficult or impossible (e.g., may clear the data stored by MRAM cell 14). For example, a fuse 84 may melt upon the application of the electrical signal generated by circuitry 16 (applied in response to detected attempted tampering) to the fuse 84, and when the fuse 84 is melted, the circuit that includes the read line may be shorted, thereby rendering the read line inoperable for reading data from the MRAM cell 14 associated with the melted fuse 84.

Each of MRAM cells 14 may include a magnetic stack 42, as described with reference to FIGS. 2, 3A-3C, and 4. In some examples, the signal may include a sufficient amplitude (e.g., a voltage amplitude or current amplitude) to damage at least one layer of magnetic stack 42. For example, the signal may include a sufficient amplitude to damage tunnel barrier layer 46. For example, an electric field strength of greater than about $2\times10^7$ V/cm for greater than about 1 ms may damage tunnel barrier layer 46. This may cause an electrical short between fixed magnetic layer 44 and free magnetic layer 48, and may render the content of magnetic stack 42 unreadable using electrical circuitry (e.g., may clear the data stored by the magnetic stack 42). However, damaging tunnel barrier layer 46 may allow recovery of the data using invasive mechanisms, such as means that directly determine a magnetic state of free magnetic layer 48.

In some examples, the signal may include a sufficient amplitude (e.g., a voltage amplitude or current amplitude) to heat at least one layer in magnetic stack 42 and cause diffusion between the at least one layer and at least one adjacent layer in magnetic stack 42. For example, the pulse may heat at least one layer in magnetic stack 42 to a temperature of greater than about 500° C. In some cases, the diffusion between adjacent layers may cause at least one of the layers in magnetic stack 42 (e.g., fixed magnetic layer 44, or free magnetic layer 48, or both) to change magnetic orientations or to no longer be able to maintain a stable magnetic orientation. This may sanitize the data stored by magnetic stack 42 (e.g., may prevent reading of the data stored by magnetic stack 42 using electrical circuitry or invasive mechanisms).

In some examples, the signal may include a sufficient amplitude (e.g., a voltage amplitude or current amplitude) to heat at least one layer in magnetic stack 42 and cause the at least one layer to melt into at least one adjacent layer of magnetic stack 42. For example, an electric field strength of greater than about $2\times10^7$ V/cm for greater than about 1 ms may damage tunnel barrier layer 46. In some examples, the pulse may heat at least one layer in magnetic stack 42 to a temperature of greater than about 500° C. In some instances, melting of at least one layer of magnetic stack 42 may sanitize data stored by the magnetic stack 42 (e.g., may prevent reading of the data stored by magnetic stack 42 using electrical circuitry or invasive mechanisms).

The signal may have a predetermined amplitude (e.g., a voltage amplitude or current amplitude) and duration that provides sufficient energy to damage the predetermined component (e.g., layer of magnetic stack 42, fuse 84, or both) in the predetermined manner (e.g., diffusion or melting). In some examples, the signal may be an electrical pulse, and may be characterized by a pulse width (pulse duration), a pulse amplitude, and, in the case of repeating pulses, a pulse frequency. In other examples, the signal may be a continuous electrical signal, and may be characterized by the signal amplitude, signal frequency, and signal wavelength.

In some examples, the signal may have an amplitude about 10 times greater than an amplitude of a signal used to write data to an MRAM cell 14. In some examples, the amplitude of a signal used to write data to an MRAM cell 14 may be about 10 times greater than an amplitude of a signal used to read data from an MRAM cell 14. Thus, in some examples, the amplitude of the signal used to damage a component of MRAM cell 14 or fuse 84 may be about 100 times greater than the amplitude of a signal used to read data from an MRAM cell 14. In some examples, an electric field used to read data from MRAM cell 14 may be less than about $1 \times 10^7$ V/cm, and an electric field used to damage MRAM cell 14 or fuse 64 may be greater than about $2 \times 10^7$ V/cm for greater than about 1 ms.

Regardless of whether circuitry 16 generates a signal that is configured to damage a MRAM cell 14, or a fuse 84, or both, by damaging at least one of MRAM cells 14 or fuses 84, circuitry 16 may complicate or prevent tampering with data stored by MRAM cells 14. For example, damaging at least one of MRAM cells 14 or at least one of fuses may sanitize or clear data stored by at least one of MRAM cells 14. Both clearing data or sanitizing data may prevent an unauthorized user (e.g., a person who is attempting to tamper with MRAM die 12) from accessing the data using electronic means. Additionally, sanitizing data may prevent an unauthorized user from accessing the data using invasive means. In this way, circuitry 16 may be configured to complicate tampering with data stored by MRAM die 12 and provide some protection of the data. Protection of data stored by MRAM die 12 with circuitry 16 in this manner may be useful if, for example, MRAM die 12 stores confidential information, such as classified information to which access is restricted by law or regulation to particular groups of persons or other intellectual property of an individual or entity.

In some examples, damaging only some of MRAM cells 14 in an MRAM die 12 or damaging fuses 84 electrically connected to only some of MRAM cells 14 is an MRAM die 12 may be sufficient to render the data stored by MRAM die 12 as a whole prior to the tampering attempt irretrievable, unintelligible, or unusable to an unauthorized user. In this way, circuitry 16 may be electrically connected to only some of MRAM cells 14 and/or fuses 84 electrically connected to only some of MRAM cells 14 and may still make access to data stored by MRAM die 12 more difficult or impossible.

Figure 6:
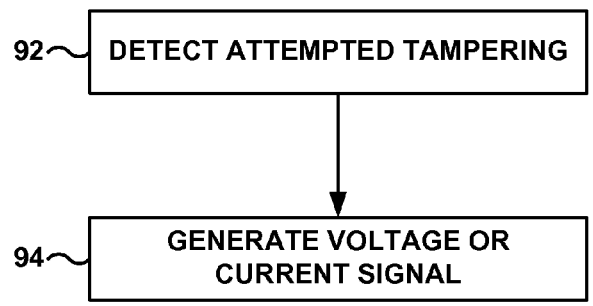
FIG. 6 is a flow diagram that illustrates an example technique for sanitizing or clearing data stored by an MRAM cell in response to attempted tampering.

FIG. 6 is a flow diagram that illustrates an example technique that circuitry 16 may execute to protect data stored by MRAM die 12 from tampering. FIG. 6 will be described with concurrent reference to MRAM package 10 of FIG. 1 and MRAM die 12 of FIG. 5. However, the technique shown in FIG. 6 may be implemented by circuitry 16 in other systems, e.g., circuitry disposed in a semiconductor die other than MRAM die 12.

As shown in FIG. 6, circuitry 16 may first detect attempted tampering with MRAM die 12 (92). In some examples, circuitry 16 may include or be electrically connected (by electrical trace 36) to a sensor 38 that is configured to sense a parameter that may be indicative of attempted tampering with MRAM die 12 or MRAM package 10. Circuitry 16 may be configured to receive the sensed parameter from sensor 38 and detect attempted tampering based on the sensed parameter. In some examples, circuitry 16 may be configured to interpret physical tampering with a portion of MRAM package 10 as an attempt to tamper with MRAM die 12. For example, sensor 38 may be configured to detect attempted physical tampering with cover 24 (e.g., removal of cover 24) or MRAM die 12 (e.g., attempted removal of surface 18 of die 12 to expose MRAM cells 14), either of which may indicate an attempt to tamper with data stored by MRAM die 12.

As another example, circuitry 16 may be configured to detect attempted tampering (92) when an unauthorized user attempts to electronically access data stored by MRAM die 12. For example, sensor 38 may include a photo sensor (e.g., light sensor) that detects a presence of an unauthorized user near a device (e.g., a computer) that includes MRAM die 12. Circuitry 16 may interpret the unauthorized presence of the person as an attempt to tamper with data stored by MRAM die 12. In some examples, circuitry 16 may be configured to detect electrical activity indicating attempted tampering with MRAM die 12 due to an access control violation. For example, data stored by MRAM die 12 may be password protected or protected by an access code. After a predetermined number of failed password or access code entries, circuitry 136 may determine than an unauthorized user is attempted to access data stored by MRAM die 12.

In response to detecting tampering (physical, electronic, or both) with MRAM die 12, circuitry 16 may be configured to generate a signal sufficient to damage or destroy at least one of MRAM cells 14, at least one of fuses 84, or at least one of both. Some MRAM die 12 may include a direct-current writing and reading, such that these direct write and read paths may also define an electrically conductive pathway for inducing data clearing or data sanitization. For example, as described above, in some examples, circuitry 16 may be electrically connected to a read line for at least one of MRAM cells 14 and the signal may be conducted from circuitry 16 to the at least one of MRAM cells 14 via the read line. In other examples, circuitry 16 may be electrically connected to a write line for at least one of MRAM cells 14 and the signal may be conducted from circuitry 16 to the at least one of MRAM cells 14 via the write line. In examples in which MRAM die 12 includes at least one fuse 84 electrically connected to at least one of MRAM cells 14, the at least one fuse 84 may be electrically connected to a read line of the at least one of MRAM cells 14. In this way, the technique shown in FIG. 6 and implemented by circuitry 16 may damage at least one of MRAM cells 14 or at least one of fuses 84, or both, which may complicate or prevent tampering with data stored by MRAM cells 14.

Although circuitry 16 has been described as being included in MRAM die 12, in other examples, circuitry 16 may be located on another semiconductor die, e.g., within MRAM package 10 (FIG. 1). As another example, circuitry 16 may be located on another semiconductor die that is disposed outside of MRAM package, e.g., another semiconductor die that is electrically connected to a printed board to which MRAM package 10 or MRAM die 12 is electrically connected.

Additionally or alternatively, circuitry 16 has been described as being configured to both detect attempted tampering and generate a signal sufficient to damage at least one of fuses 84, at least one of MRAM cells 14, or at least one of fuses 84 and at least one of MRAM cells 14. However, in some examples, a first circuitry may be configured to detect attempted tampering and a second circuitry may be configured to generate the signal sufficient to damage at least one of fuses 84, at least one of MRAM cells 14, or at least one of fuses 84 and at least one of MRAM cells 14. The first circuitry and second circuitry may be a part of a single semiconductor die, e.g., MRAM die 12, or may be part of different semiconductor dice. For example, the first circuitry configured to detect attempted tampering may be a part of another die disposed within MRAM package 10 or outside of MRAM package 10 and the second circuitry configured to generate the signal may be part of MRAM die 12.

Various examples have been described. These and other examples are within the scope of the following claims.

What is claimed is:

1. A system comprising:
    a magnetoresistive random access memory (MRAM) die comprising at least one MRAM cell; and
    circuitry configured to detect attempted tampering with the MRAM die and generate an electrical signal sufficient to damage the at least one MRAM cell in response to detecting the attempted tampering with the MRAM die.

2. The system of claim 1, wherein the MRAM die comprises the circuitry.

3. The system of claim 1, further comprising a semiconductor die, wherein the semiconductor die comprises the circuitry.

4. The system of claim 3, further comprising an MRAM package, wherein the MRAM die is disposed in the MRAM package, and wherein the semiconductor die is disposed in the MRAM package.

5. The system of claim 3, further comprising an MRAM package, wherein the MRAM die is disposed in the MRAM package, and wherein the semiconductor die is disposed outside the MRAM package.

6. The system of claim 1, further comprising a sensor configured to generate a sensor signal indicative of tampering with the MRAM die, wherein the circuitry is configured to detect the attempted tampering with the MRAM die based on the sensor signal indicative of tampering with the MRAM die.

7. The system of claim 1, wherein the electrical signal comprises a current amplitude of about 10 times an amplitude of a write current used to write data to the at least one MRAM cell.

8. The system of claim 1, further comprising a read path for the at least one MRAM cell, wherein the circuitry is electrically connected to the read path, wherein the at least one MRAM cell is electrically connected to the read path, and wherein the electrical signal conducts from the circuitry to the at least one MRAM cell via the read path.

9. The system of claim 1, wherein the MRAM cell comprises a tunnel barrier layer, wherein the at least one MRAM cell comprises a tunnel barrier layer, and wherein the electrical signal comprises an electrical signal sufficient to damage the tunnel barrier layer.

10. The system of claim 1, wherein the at least one MRAM cell comprises a plurality of layers, and wherein the electrical signal comprises an electrical signal sufficient to melt at least one layer of the plurality of layers of the at least one MRAM cell.

11. The system of claim 1, wherein the at least one MRAM cell comprises a first layer and a second layer, and wherein the electrical signal comprises an electrical signal sufficient to cause diffusion between the first and second layers of the at least one MRAM cell.

12. A system comprising:
    a magnetoresistive random access memory (MRAM) die comprising:
        at least one MRAM cell,
        a read line electrically connected to the at least one MRAM cell, and
        a fuse electrically connected to the read line; and
    circuitry configured to detect attempted tampering with the MRAM die and generate an electrical signal sufficient to damage the fuse in response to detecting the attempted tampering with the MRAM die.

13. The system of claim 12, wherein the MRAM die comprises the circuitry.

14. The system of claim 12, further comprising a semiconductor die, wherein the semiconductor die comprises the circuitry.

15. The system of claim 14, further comprising an MRAM package, wherein the MRAM die is disposed in the MRAM package, and wherein the semiconductor die is disposed in the MRAM package.

16. The system of claim 14, further comprising an MRAM package, wherein the MRAM die is disposed in the MRAM package, and wherein the semiconductor die is disposed outside the MRAM package.

17. The system of claim 12, further comprising a sensor configured to generate a sensor signal indicative of tampering with the MRAM die, wherein the circuitry is configured to detect the attempted tampering with the MRAM die based on the sensor signal indicative of tampering with the MRAM die.

18. A method comprising:
    detecting attempted tampering with a magnetoresistive random access memory (MRAM) die; and
    in response to detecting the attempted tampering with the MRAM die, generating an electrical signal sufficient to damage at least one MRAM cell in the MRAM die or a fuse electrically connected to a read line of the at least one MRAM cell.

19. The method of claim 18, wherein the at least one MRAM cell comprises a tunnel barrier layer, and wherein the electrical signal comprises an electrical signal sufficient to damage the tunnel barrier layer.

20. The method of claim 18, wherein the at least one MRAM cell comprises a plurality of layers, and wherein the electrical signal comprises an electrical signal sufficient to melt at least one layer of the plurality of layers of the at least one MRAM cell.

* * * * *